United States Patent
Cowley et al.

(10) Patent No.: US 9,231,524 B2
(45) Date of Patent: Jan. 5, 2016

(54) DIGITAL TRANSCEIVER WITH SWITCHED CAPACITOR SAMPLING MIXERS AND SWITCHED CAPACITOR AMPLIFIERS

(71) Applicants: Nicholas Cowley, Wroughton (GB); Viacheslav Suetinov, Swindon (GB)

(72) Inventors: Nicholas Cowley, Wroughton (GB); Viacheslav Suetinov, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/101,123

(22) Filed: Dec. 9, 2013

(65) Prior Publication Data

US 2014/0204985 A1    Jul. 24, 2014

Related U.S. Application Data

(60) Provisional application No. 61/754,288, filed on Jan. 18, 2013.

(51) Int. Cl.
| | |
|---|---|
| *H04B 1/40* | (2015.01) |
| *H03D 7/14* | (2006.01) |
| *H03D 7/16* | (2006.01) |
| *H03F 3/45* | (2006.01) |
| *H03M 1/44* | (2006.01) |
| *H03H 19/00* | (2006.01) |
| *H03F 3/00* | (2006.01) |

(52) U.S. Cl.
CPC ............. *H03D 7/1466* (2013.01); *H03D 7/165* (2013.01); *H04B 1/40* (2013.01); *H03F 3/005* (2013.01); *H03F 3/45475* (2013.01); *H03F 2203/45514* (2013.01); *H03F 2203/45551* (2013.01); *H03H 19/004* (2013.01); *H03M 1/442* (2013.01)

(58) Field of Classification Search
CPC ................ H03F 3/005; H03F 3/45475; H03F 2203/45551; H03F 2203/45514; H03M 1/442; H03H 19/004
USPC ........ 375/219; 341/150, 172; 327/337; 330/7
See application file for complete search history.

(56) References Cited

U.S. PATENT DOCUMENTS 7,286,810 B1 * 10/2007 Wong et al. ................... 455/323

* cited by examiner

*Primary Examiner* — Leila Malek (74) *Attorney, Agent, or Firm* — Schwegman Lundberg & Woessner, P.A.

(57) ABSTRACT

Examples of a digital transceiver, a switched-capacitor sampling mixer, and an N-stage switched-capacitor amplifier are generally described herein. The digital transceiver may include a plurality of switched-capacitor sampling mixers and a plurality of N-stage switched-capacitor amplifiers. Each mixer samples a received differential RF signal. The pair of N-stage switched-capacitor amplifiers operates as charge redistribution amplifiers. Each N-stage switched-capacitor amplifier provides a near-constant capacitive load for one of the mixers.

23 Claims, 6 Drawing Sheets

DIGITAL TRANSCEIVER WITH SWITCHED CAPACITOR SAMPLING MIXERS AND SWITCHED CAPACITOR AMPLIFIERS

PRIORITY CLAIM

This application claims the benefit of priority under 35 U.S.C. 119(e) to U.S. Provisional Patent Application Ser. No. 61/754,288, filed Jan. 18, 2013, which is incorporated herein by reference in its entirety.

TECHNICAL FIELD

Examples pertain to wireless communications. Some examples relate to transceivers. Some examples relate to direct-conversion receivers. Some examples relate to digital simplex transceivers. Some examples relate to charge-redistribution techniques applied to mixers and amplifiers.

BACKGROUND

One issue with conventional transceivers is power consumption. Many conventional transceivers are implemented using analog building blocks which may include low-noise amplifier (LNAs), mixers, active filters, etc. These analog building blocks necessarily have an inherent bias current which results in excess power consumption. Reducing the bias current in these analog building blocks may compromise performance. There is generally a limit to the level that the bias current can be reduced to, depending on modulation and operating condition requirements which set certain performance requirements of a transceiver.

One conventional technique to reduce power consumption is to cycle the bias current by switching various circuits within the transceiver from an active state to low power or standby state. To minimize power consumption, the on-period or active state time is minimized, however, set-up and disable periods that occur while the circuits transition between states to establish proper operating conditions limit the amount of power saving that can be achieved. Another issue with analog building blocks is that they are becoming more challenging to implement on deep sub-micron process nodes making it desirable to minimize the analog block content as well as minimize the implementation area.

Thus, there are general needs for transceivers that operate with reduced power consumption. There are also general needs for transceivers that minimize analog block content as well as minimize the implementation area for analog blocks.

DETAILED DESCRIPTION

The following description and the drawings sufficiently illustrate specific examples to enable those skilled in the art to practice them. Other examples may incorporate structural, logical, electrical, process, and other changes. Portions and features of some examples may be included in, or substituted for, those of other examples. Examples set forth in the claims encompass all available equivalents of those claims.

Figure 1:
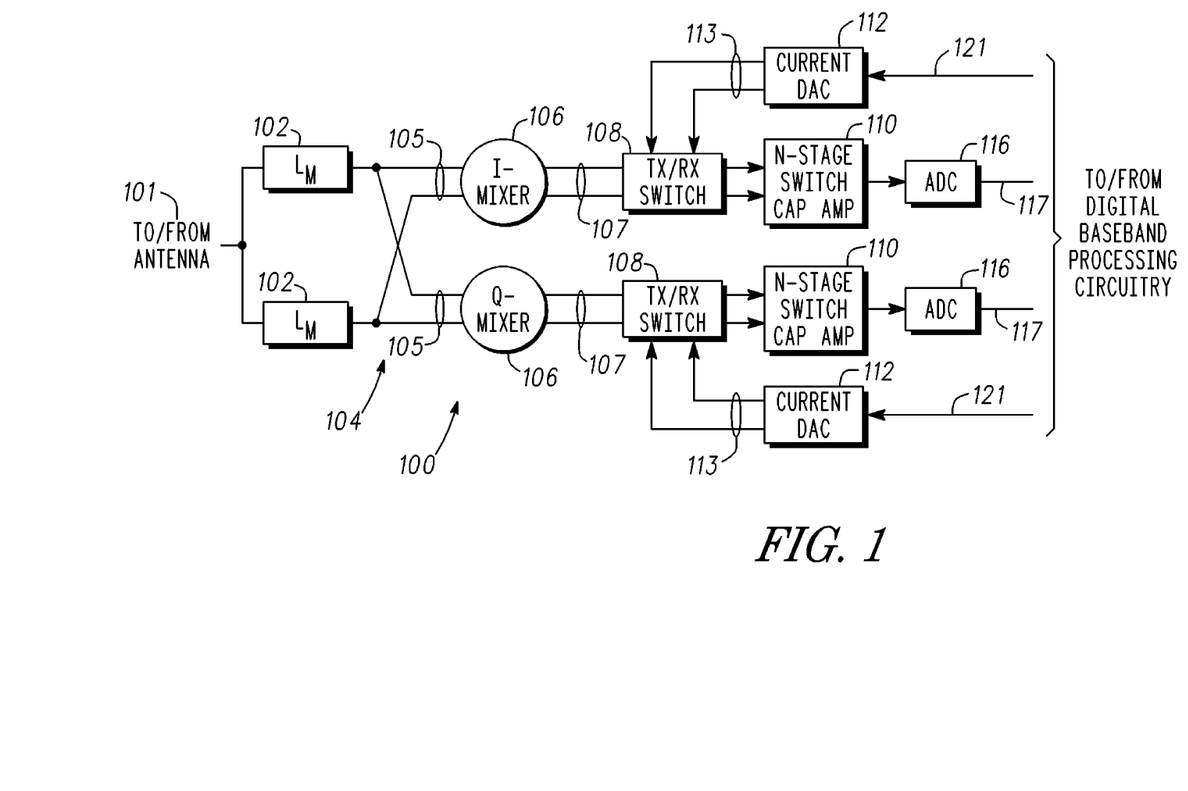
FIG. 1 is a functional diagram of a digital transceiver in accordance with some examples.

FIG. 1 is a functional diagram of a digital transceiver in accordance with some examples. The digital transceiver 100 may include a pair of switched-capacitor sampling mixers 106 and a pair of N-stage switched-capacitor amplifiers 110. Each switched-capacitor sampling mixer 106 may receive a differential radio-frequency (RF) signal 105. The pair of N-stage switched-capacitor amplifiers 110 may be configured to operate as charge redistribution amplifiers. Each switched-capacitor amplifier 110 may provide a constant capacitive load for one of the mixers 106. This architecture is based on charge-redistribution techniques that will help eliminate analog building blocks and result in reduced power consumption. Each switched-capacitor sampling mixer 106 provides mixing from the frequency band around the local-oscillator (LO) frequency with a bandwidth defined by charge integration time. These examples are discussed in more detail below.

In some examples, coupling capacitive elements of the switched-capacitor sampling mixers 106 are configured to sample the differential RF signal 105 and a capacitive load, provided, at least in part, by the N-stage switched-capacitor amplifiers 110, integrating the switched output signal provided by the switched-capacitor sampling mixers 106. In these examples, the number of stages (N) of a switched-capacitor amplifier 110 may be as little as one and may be as great as eight or more, although the scope of the examples is not limited in this respect. In some examples, the digital transceiver 100 includes a pair of two-stage switched-capacitor amplifiers 110. These examples are discussed in more detail below. In some examples, the capacitive load provided by each switched-capacitor amplifier 110 may range between 10 and 20 pF, although the scope of the examples is not limited in this respect.

In some examples, the pair of switched-capacitor sampling mixers 106 may include an in-phase mixer (I-mixer) and a quadrature-phase mixer Q-mixer). Each mixer 106 may be configured to receive a differential RF signal 105 and generate a switched output signal. The switched output signal may be a differential baseband signal 107.

In some examples, the digital transceiver 100 may be a digital simplex transceiver configurable to operate in either receive (RX) mode or in transmit (TX) mode. In these examples, the mixers 106 are bi-directional and each mixer 106 may be configurable to operate in either receive mode or transmit mode. In these examples, the digital transceiver 100 may be configured to transmit and receive at different times and may be configured to transmit and receive on the same frequency or frequency range. In these examples, during receive mode, RF input signals may be down-converted by the mixers 106 for subsequent generation of baseband signals 117 for output by transceiver 100. In some examples, the output of the transceiver 100 may be analog output signals provided by the switched-capacitor amplifiers 110. In transmit mode, baseband signals 121 may be provided to transceiver 100 and up-converted by mixers 106 to RF signals, which may be provided to input port 101 (e.g., for transmission by an antenna). In some alternate examples, separate receive and transmit paths may be provided to allow the transceiver 100 to transmit and receive at the same time and/or on different RF frequencies.

In some examples, the output signals provided by the N-stage switched-capacitor amplifiers 110 may be provided to analog-to-digital conversion (ADC) circuitry 116 to generate the digital baseband signals 117 for subsequent processing by digital baseband circuitry. In some examples, the transceiver 100 may also include a TX/RX switch 108 provided in the signal path between each mixer 106 and an associated N-stage switched-capacitor amplifier 110. A current source such as a digital-to-analog converter (DAC) 112 may be configured to provide analog baseband signals 113 to each TX/RX switch 108 including current for injection into the mixers 106 when operating in transmit mode. These examples are described in more detail below.

In some examples, transceiver 100 may be an all-digital transceiver that is implemented in complementary metal-oxide semiconductor (CMOS) technology, although this is not a requirement as other integrated circuit technologies may also be used.

In some examples, the differential RF signal 105 may be provided by an RF source. In some examples, the RF source may be an input port 101 (e.g., an antenna port), although the scope of the examples is not limited in this respect as the RF source may be any RF signal source such as a cable signal source (e.g., CATV) or a wireless signal source. In some examples, an LNA may be provided between the RF source and the mixers 106, although the scope of the examples is not limited in this respect.

In some examples, transceiver 100 may also include impedance transform elements (Lm) 102 coupled between the input port 101 and the mixers 106. In some examples, differential coupling circuitry 104 may also be provided between the input port 101 and the mixers 106. These examples are discussed in more detail below.

In some examples, the digital transceiver 100 may be part of a portable wireless communication device, such as a personal digital assistant (PDA), a mobile device, a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some examples, a mobile device may include one or more of a keyboard, a display, a non-volatile memory port, multiple antennas, a graphics processor, an application processor, speakers, and other mobile device elements. The display may be a liquid-crystal display (LCD) screen including a touch screen.

Although the digital transceiver 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some examples, the functional elements may refer to one or more processes operating on one or more processing elements.

Figure 2:
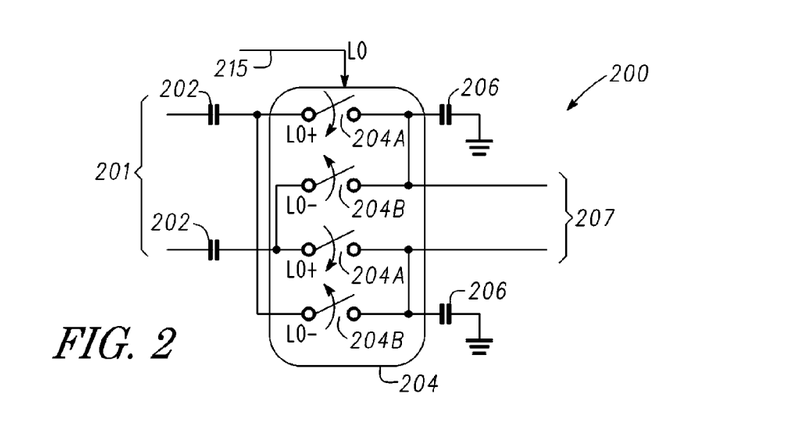
FIG. 2 is a diagram of a switched-capacitor sampling mixer in accordance with some examples.

FIG. 2 is a diagram of a switched-capacitor sampling mixer in accordance with some examples. The switched-capacitor sampling mixer 200 may be suitable for use as one or both of the switched-capacitor sampling mixers 106 (FIG. 1). The switched-capacitor sampling mixer 200 may include a pair of the coupling capacitive elements 202 to receive a differential RF signal 201, a set of switching elements 204 responsive to a local-oscillator (LO) signal 215. The set of switching elements 204 is coupled between the coupling capacitive elements 202 and a capacitive load. The switching elements 204 may be configured to cause the coupling capacitive elements 202 to sample the differential RF signal 105 and cause the capacitive load to integrate a switched output signal 207 provided by the set of switching elements 204.

The switched-capacitor sampling mixer 200 may optionally include a pair of differential load capacitive elements 206 to provide at least part of the capacitive load to integrate the switched output signal 207. The differential load capacitive elements 206 may be configured to integrate the switched output signal 207 provided by the set of switching elements 204.

As illustrated in FIG. 2, switching elements 204A may be closed during one half of the LO cycle, and switching elements 204B may be closed during the other half of the LO cycle. In some examples, the switching elements 204 are responsive to the LO signal 215 to cause the each coupling capacitive element 202 to charge the capacitive load (provided by both of the load capacitive elements 206 and/or the N-stage switched-capacitor amplifier 110) during the LO cycle. This is unlike conventional switched-capacitor circuits since in these examples the charge of the switched-capacitors (i.e., coupling capacitive elements 202) is never discharged to ground but is used twice for charging a capacitive load. In these examples, the charge is passed between the coupling capacitive elements 202 and the capacitive load. These examples may increase current flow up to two times for the same capacitance values and LO frequency. This may allow usage of smaller capacitor values, reducing circuit area.

In these examples, the switched-capacitor sampling mixer 200 may have a conversion gain close to unity if the ratio of the value of the capacitive load (e.g., load capacitive elements 206) to the coupling capacitive elements 202 is significantly higher than 1. The bandwidth may also be related to the ratio of the value of the capacitive load to the coupling capacitive elements 202 and also proportional to LO frequency.

In some examples, the coupling capacitive elements 202 are provided in series between impedance transform elements (Lm) 102 (FIG. 1) and the set of switching elements 204. In some of these examples, the impedance transform elements 102 may be coupled between an input port and the mixers 106 and may be selected to transform a substantially capacitive impedance of the coupling elements 202 to a real input port (101) impedance (e.g., a 50 Ohm). In this case, the real part of mixer impedance is due to the switch elements and track resistance.

In some examples, the pair of load capacitive elements 206 may be coupled between the set of switching elements 204 and ground. The input port 101 (FIG. 1) may be differentially coupled to each of the I-mixer and Q-mixer 106 through impedance transform elements 102. Differential coupling circuitry 104 (FIG. 1) may provide a differential connection for each mixer 106 to the input port 101 through the impedance transform elements 102. In some of these simplex examples, no LNA is provided between the input port 101 and the mixers 106.

In some examples, the coupling capacitive elements 202 may sample the differential RF signal 201 when the switching elements 204 are in the switched state (i.e., when either switching elements 204A are in a closed position or when switching elements 204B are in a closed position) during which a sampled charge accumulates on the coupling capacitive elements 202. In these examples, the switching elements 204 may cause the sampled charge on the coupling capacitive elements 202 to integrate onto the load capacitance at the moment immediately after switching (i.e., when either switching elements 204A open or switching elements 204B open). In these examples, when the switching frequency is close to the input signal frequency, successive integration samples may become substantially coherent and lead to a build-up of charge resulting in a down-conversion of the input signal.

Figure 4:
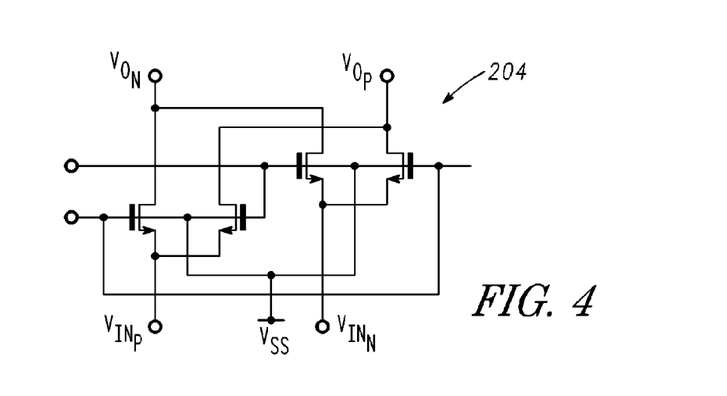
FIG. 4 illustrates a switching element configuration in accordance with some examples.

In some examples, the set of switching elements 204 may comprise a set of cross-coupled transistors. The transistors, for example, may be either P-channel or N-channel devices. In some examples, the transistors may comprise NMOS transistors, an example of which is illustrated in FIG. 4.

Figure 3:
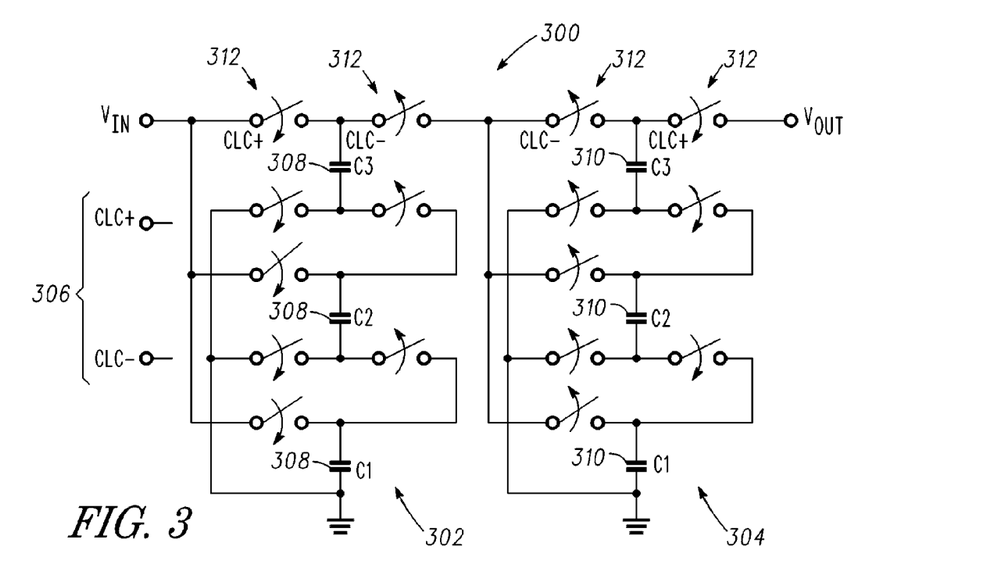
FIG. 3 is a diagram of a two-stage switched-capacitor subcell amplifier in accordance with some examples.

FIG. 3 is a diagram of a two-stage switched-capacitor subcell amplifier 300 in accordance with some example aspects of the present disclosure. In some examples, each N-stage switched-capacitor amplifier 110 (FIG. 1) may comprise a parallel combination of two or more switched-capacitor subcell amplifiers 300. In these examples, a parallel combination of two switched-capacitor subcell amplifiers 300 may be configured to provide a near-constant capacitive load during both halves of a switching period as a single switched-capacitor subcell amplifier 300 may provide a load capacitance during one-half of the switching period. These examples are described in more detail below.

In some examples, the N-stage switched-capacitor amplifiers 110 may provide most or all of the capacitive load for the mixers 106. In these examples, the load capacitive elements 206 (FIG. 2) are optional and may not be required. In other example, the N-stage switched-capacitor amplifiers 110 may provide only part of the capacitive load for the mixers 106 and the load capacitive elements 206 may provide part of the capacitive load for the mixers 106.

In an example in which the N-stage switched-capacitor amplifiers 110 provide capacitive load, the N-stage switched-capacitor amplifiers 110 may integrate the switched output signal 207 provided by the switching elements 204. This capacitive load adds an additional time constant which depends on the clock frequency (CLC) of clock signal 306 and the values of capacitive elements 308 and 310. In this way, the N-stage switched-capacitor amplifiers 110 provide improved controlled filtering.

In some examples, the capacitive load provided by a combination of the load capacitive elements 206 and the N-stage switched-capacitor amplifiers 110 may be at least five times (5×) greater than a capacitance of the coupling capacitive elements 202.

In some examples, the N-stage switched-capacitor amplifiers 110 are two-stage switched-capacitor amplifiers (i.e., N=2) and each switched-capacitor subcell amplifier 300 comprises a first stage 302 and a second stage 304 arranged in series. Each stage comprises a set of switching elements 312 and a set of capacitive elements 308 or 310 as illustrated in FIG. 3. In this example, the sets of switching elements 312 are responsive to the clock cycle provided by a clock signal 306 to cause each switched-capacitor subcell amplifier 300 to provide at least part of the capacitive load (e.g., for the mixers 106) during half of the clock cycle.

In some examples, during one-half of the switching cycle (i.e., the clock cycle), the first stage 302 may provide a load to Vin while the second stage 304 provides Vout and stages 302 and 304 are isolated from each other. During the other half of the switching cycle, the first stage 302 is isolated from Vin and the second stage 304 is isolated from Vout and stages 302 and 304 are configured to perform charge sharing.

In response to the clock cycle, the set of switching elements 312 arrange the capacitive elements 308 of the first stage 302 in parallel and arrange the capacitive elements 310 of the second stage 304 in series during the first half of the clock cycle. During the second half of the clock cycle, the set of switching elements 312 arrange the capacitive elements 310 of the second stage 304 in parallel and arrange the capacitive elements 308 of the first stage 302 in series. During the first half of the clock cycle, the first and second stages 302, 304 are isolated from each other. During the second half of the clock cycle the first and second stages 302, 304 are electrically coupled to each other. Accordingly, a near-constant capacitive load for each of the mixers 106 can be provided by the switched-capacitor subcell amplifier 300 during the first half the clock cycle. A near constant capacitive load may be provided during the second half of the clock cycle by providing a second subcell whose clocking is in antiphase with the first. In some examples, more than two subcell elements may be provided and the clocking arranged so that only one of the more than two subcells are connected to Vin and Vout at the same time.

In some examples, each switched-capacitor subcell amplifier 300 may operate as a charge redistribution amplifier. Each stage 302 and 304 may exploit fast switching digital transistors to move charge between the capacitive elements to provide voltage gain as the capacitive elements are reconfigured between series and parallel configurations. In these examples, gain is achieved by switching the capacitive elements 308, 310 from a parallel to a series configuration.

In some examples, the switched-capacitor subcell amplifier 300 may operate as a variable gain charge redistribution amplifier. In these examples, the gain may be varied by controlling the switching arrangement of the switching elements 312. In some fixed gain examples of the N-stage switched-capacitor amplifiers 110, the switching elements 312 cause all capacitive elements (i.e., C1, C2 and C3) to switch from parallel-to-series and series-to-parallel at about the same time. In some variable-gain examples, not all of the capacitive elements (i.e., C1, C2 and C3) are switched from parallel-to-series and series-to-parallel at the same time. In these variable-gain examples, different numbers of the switching elements 312 switch to provide variable gain. For example, if three of the capacitive elements (i.e., C1, C2 and C3) are switched between parallel and series, a gain of 3× may result, while if two of the capacitive elements (e.g., C1 and C2) are switched between parallel and series, a gain of 2× may result.

When the switching elements 312 labeled as being controlled by CLC+ (shown with a down arrow) are closed and switching elements 312 labeled as being connected to CLC− (shown with an up arrow) are open, the capacitive elements 308 are in a parallel configuration and connected to Vin (the input) and the capacitive elements 310 are in series and connected to Vo (the output). In addition, stage 302 is isolated from stage 304. When the switching elements 312 labeled as being controlled by CLC− are closed and switching elements 312 labeled as being connected to CLC+ are open, the capacitive elements 308 are in a series configuration and isolated from Vin and the capacitive elements 310 are in a parallel configuration and isolated from Vo. In addition, stage 302 is connected to stage 304, causing the series arrangement of capacitive elements 308 connected to the parallel arrangement of capacitors 310.

As discussed above, in some examples, each of the N-stage switched-capacitor amplifiers 110 (FIG. 1) may comprise a parallel combination of two switched-capacitor subcell amplifiers 300 (FIG. 3). An example of these examples is illustrated in FIG. 5.

Figure 5:
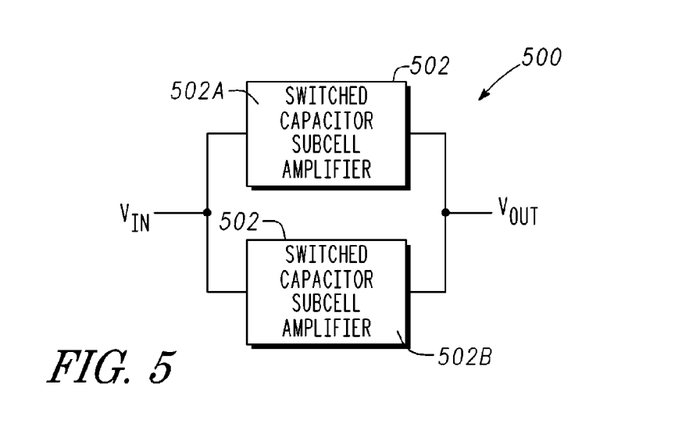
FIG. 5 illustrates an N-stage switched-capacitor amplifier in accordance with some examples.

FIG. 5 illustrates an N-stage switched-capacitor amplifier in accordance with some examples. The N-stage switched-capacitor amplifier 500 may be suitable for use as both of the N-stage switched-capacitor amplifiers 110 (FIG. 1). The N-stage switched-capacitor amplifier 500 comprises a parallel combination of two switched-capacitor subcell amplifiers 502. The switched-capacitor subcell amplifier 300 (FIG. 3) may be suitable for use for each of switched-capacitor subcell amplifiers 502.

In these examples, the switched-capacitor subcell amplifiers 502 are configured to clock in anti-phase with each other so that one of the switched-capacitor subcell amplifiers 502 (e.g., amplifier 502A) provides at least part of the capacitive load during one-half of a clock cycle and another of the switched-capacitor subcell amplifiers 502 (e.g., amplifier 502B) provides at least part of the capacitive load during the other half of the clock-cycle to maintain a near-constant capacitive load. The near-constant capacitive load may be provided for an associated one of the mixers 106. In some examples, as discussed above, part of the capacitive load may also be provided by the load capacitive elements 206 (FIG. 2).

Figure 6:
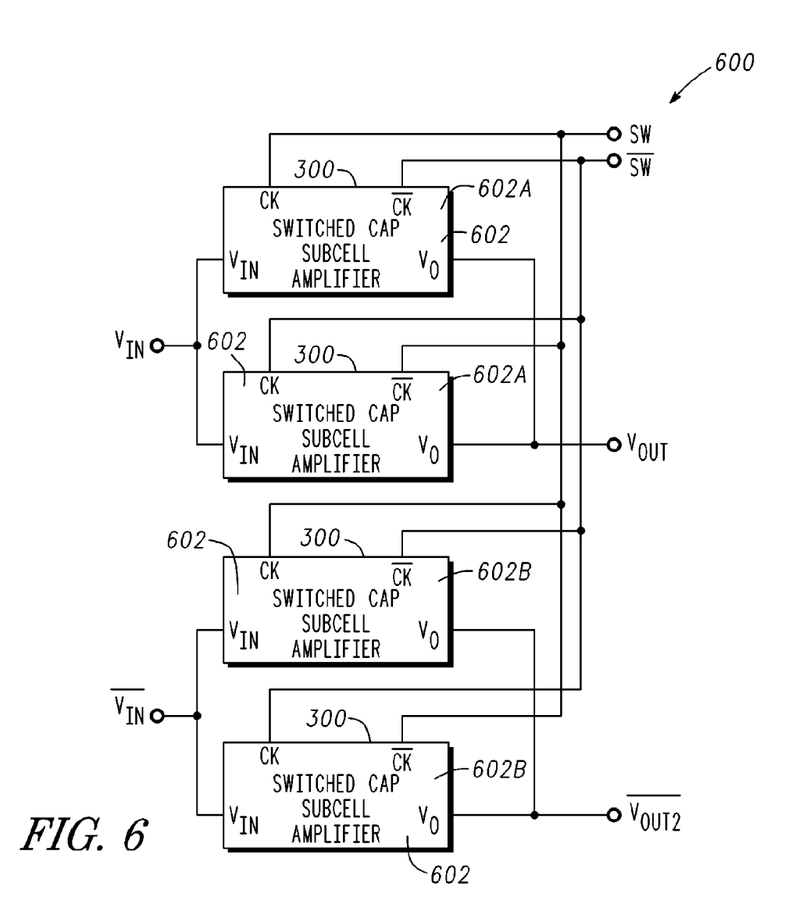
FIG. 6 illustrates an N-stage differential switched-capacitor amplifier in accordance with some examples.

FIG. 6 illustrates an N-stage differential switched-capacitor amplifier in accordance with some examples. The N-stage differential switched-capacitor amplifier 600 comprises two pairs of switched-capacitor subcell amplifiers 602. One pair is formed by switched-capacitor subcell amplifiers 602A, and the other pair is formed by switched-capacitor subcell amplifiers 602B. The switched-capacitor subcell amplifier 300 (FIG. 3) may be suitable for use as each switched-capacitor subcell amplifier 602. As illustrated in FIG. 6, the N-stage differential switched-capacitor amplifier 600 is a two-stage differential example of the N-stage switched-capacitor amplifier 110 (FIG. 1) which comprises two associated pairs of subcell amplifiers 300 (FIG. 3) where each pair is associated with one of the signals of a complementary pair (i.e., Vin and Vinbar). Each subcell in each pair may be arranged so that their switching is in anti-phase to provide a near-constant source and load capacitance.

As illustrated in FIG. 6, a differential amplifier is formed by an arrangement of four single ended stages where each stage is a switched-capacitor subcell amplifier 602. In FIG. 6, switch signal SW may correspond to CLK+ (FIG. 3) and switch signal SWbar may correspond to CLK−.

Figure 7:
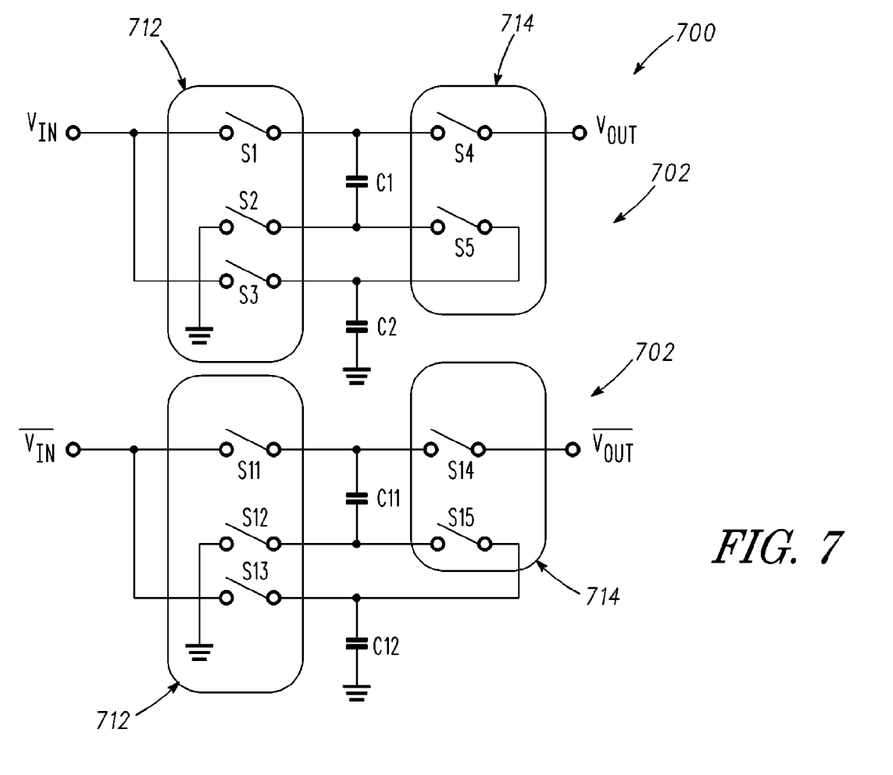
FIG. 7 illustrates a differential gain stage in accordance with some examples.

FIG. 7 illustrates a differential gain stage in accordance with some examples. Differential gain stage 700 may comprise two single-ended amplifier stages 702 configured to provide a differential gain stage 700. Differential gain stage 700 may be suitable for use as one stage of an N-stage switched-capacitor amplifier 110 (FIG. 1). Differential gain stage 700 may be extended to an N-stage amplifier by those of ordinary skill in the art.

In these examples, single ended amplifier stages 702 are configured to provide a differential gain stage 700, switches 712 (S1, S2, S3, S11, S12 and S13) may be configured to switch in anti-phase with switches 714 (S4, S5, S14 and S15). When switches 712 are closed and switches 714 are open, the capacitors (C1 and C2 and C11 and C12) are switched in parallel between Vin or Vinbar and ground. When switches 712 are open and switches 714 are closed, capacitors are arranged in series and isolated from Vin and connected to Vout. The voltage step up may be up to 6 dB or more if more capacitors are switched, for example.

Figure 8:
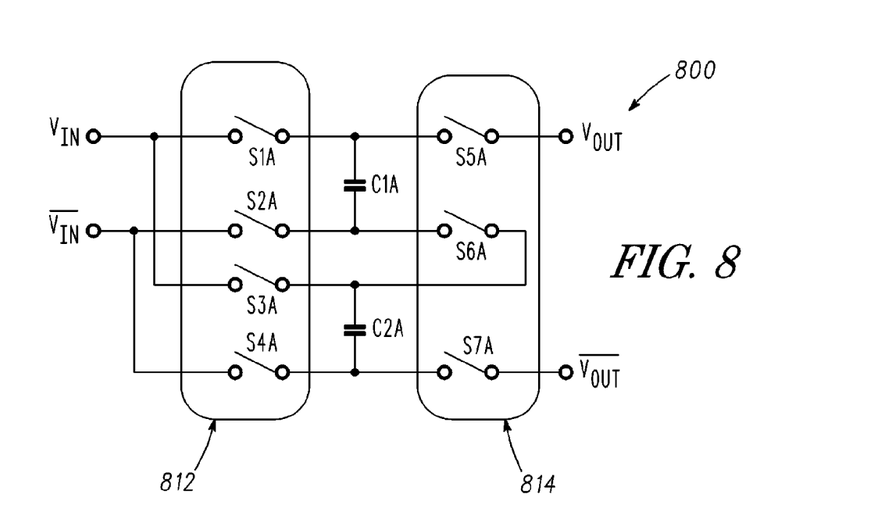
FIG. 8 illustrates a differential switched-capacitor amplifier stage in accordance with some examples.

FIG. 8 illustrates a differential switched-capacitor amplifier stage in accordance with some examples. Differential switched-capacitor amplifier stage 800 is a differential equivalent to the differential gain stage 700 (FIG. 7) and may be suitable for use as one stage of an N-stage switched-capacitor amplifier 110 (FIG. 1). Differential switched-capacitor amplifier stage 800 may be extended to an N-stage amplifier by those of ordinary skill in the art. In these examples, switches 812 (S1A, S2A, S3A and S4A) are switched together and switches 814 (S5A, S6A and S7A) are switched together. Switches 814 are switches in anti-phase to switches 812. When switches 812 are closed, the capacitors (C1A and C2A) are switched across the differential input (Vin VinBar) and isolated from the differential output (Vout, VoutBar). When switches 814 are closed, the capacitors (C1A and C2A) are isolated from the differential input and switched in series between Vout and VoutBar providing a differential voltage step up of 6 dB, for example. In these examples, capacitor C1A may be an equivalent to the series combination of C1 and C11 (FIG. 7) and C2A may be an equivalent to the series combination of C2 and C12 (FIG. 7) providing for a capacitor size reduction.

Referring to FIGS. 1 and 2, in some examples, the switched-capacitor sampling mixers 106 (FIG. 1) may be configured to have a substantially constant input impedance set by the switching elements 204 (FIG. 2) and the input coupling capacitor element 202 (FIG. 2). The input impedance may be matched to a 50 ohm port by an appropriate matching circuit which includes impedance transform elements 102 and may also include the input parasitic capacitance. A tuned input match implements both a first gain due to the Q factor being greater than unity, and a bandpass characteristic which provides a first RF filtering at the input port and variation in switching element impedance may predominantly impact the Q factor of this response. Tuned input matching to allow for process variation may be implemented by deploying a switched capacitor array (not illustrated).

For the receive path, each mixer 106 may be operated in forward mode and the output may be coupled to a charge redistribution variable gain stage, such as the N-stage switched-capacitor amplifier 110 (FIG. 1). The mixers 106 provides a second filtering characteristic that may be set by the ratio of input and output capacitance and the LO frequency. The variable gain stage may provide a third filtering characteristic set by the ratio of the capacitances within first and second stages of the amplifiers 110. In some examples, additional variable gain stages may be included to increase the filter order. In some examples, three stages of filtering may be sufficient for operation without requiring additional filtering stages, thus saving area and power. In addition, the output load capacitance for the mixer 106 (i.e., as provided by load capacitive elements 206 (FIG. 2)) may be presented by the input capacitance of the variable gain stage thus eliminating components, and/or the second stage equivalent capacitance of the variable gain stage could be formed from a capacitor array which may part of a successive-approximation-register (SAR) ADC (i.e., when an ADC is deployed) further reducing components.

In some examples, each mixer 106 may be bidirectional and the down-converted signal is also automatically up-converted, hence potentially leading to retransmission of the received signal in the inverted sideband. A quadrature conversion architecture, for example, in the described simplex example, however, fundamentally cancels this signal through image cancellation.

For the transmit path, in simplex operation, each mixer 106 operates in reverse mode, thus consolidating the mixing function into a single block and saving area. In these examples, the input to each mixer 106 in transmit mode may be fed from a current DAC 112. Since the reverse path (in transmit mode) may be identical to the receive path, the same first and second filtering characteristics are applied to the transmit spectrum as well. In some examples, the transmit power may be limited by the sustainable voltage of switching elements 204 (FIG. 2). For a typical digital transistor implemented in deep submicron, output power may be limited, for example, to −5 dBm, however, thick oxide devices may be employed to provide increased transmit power levels.

Figure 9:
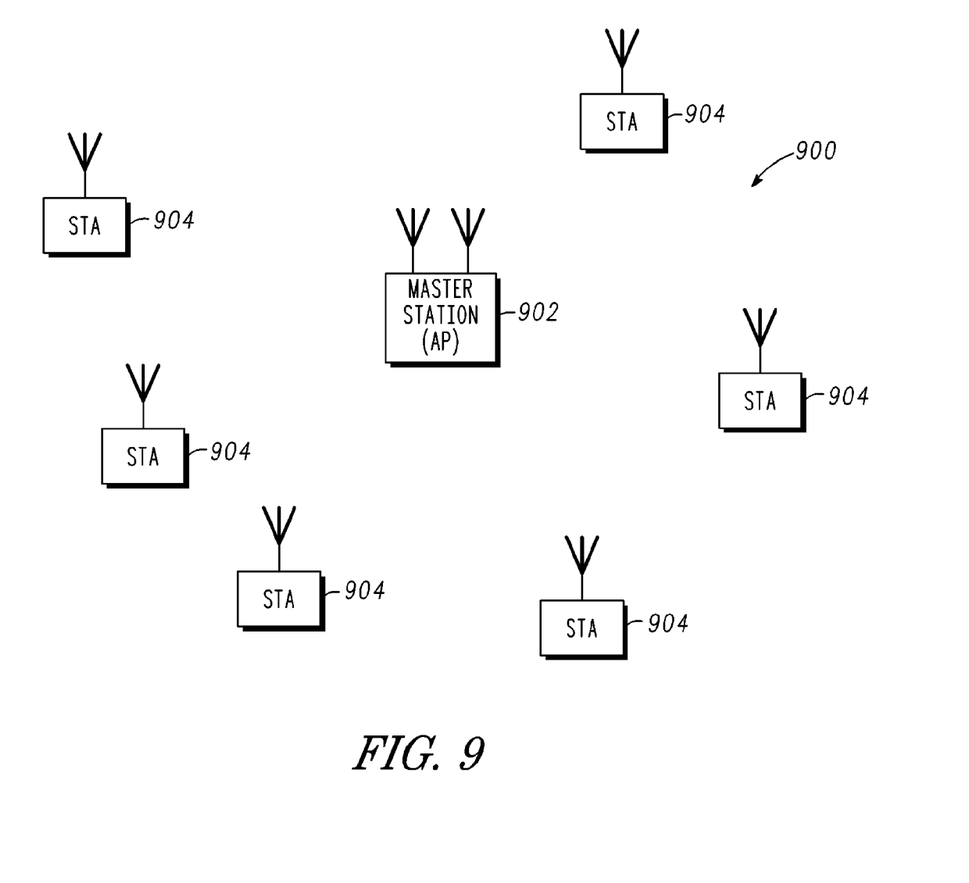
FIG. 9 illustrates a wireless network in accordance with some examples.

FIG. 9 illustrates a wireless network in accordance with some examples. Wireless network 900 may include a plurality of wireless communication stations (STAs) including a master station 902 and a plurality of remote stations 904. The master station 902 may be an access point (AP), a base station or an enhanced node B (eNB). The remote stations 904 may comprise mobile or portable wireless devices, although the scope of the examples is not limited in this respect. In some examples, the digital transceiver 100 (FIG. 1) may be suitable for use as part of any one of the wireless stations including the master station 902 or a remote station 904.

In some examples, wireless network 900 may be configured to operate in accordance with specific communication standards, such as the Institute of Electrical and Electronics Engineers (IEEE) standards including IEEE 802.11-2012 and/or 802.11n-2009 standards and/or proposed specifications for wireless local-area networks (WLANs), although the scope of the example is not limited in this respect as they may also be suitable to operate in accordance with other techniques and standards. In some examples, wireless network 900 may be configured to operate in accordance with the Universal Terrestrial Radio Access Network (UTRAN) LTE communication standards.

Figure 10:
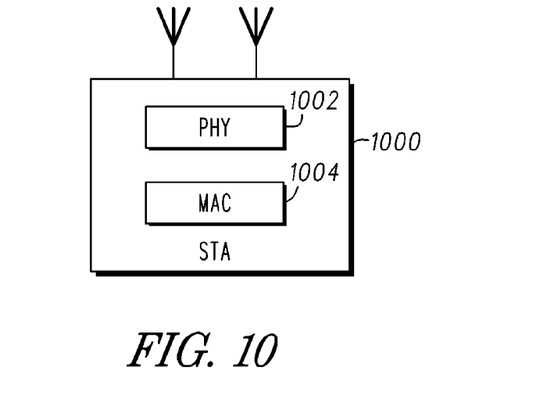
FIG. 10 illustrates a wireless communication station in accordance with some examples.

FIG. 10 illustrates a wireless communication station in accordance with some examples. In accordance with examples, wireless communication station (STA) 1000 may include, among other things, physical layer (PHY) 1002 and medium-access control layer (MAC) 1004. PHY 1002 and MAC 1004 may be compliant with one or more wireless communications standards. PHY 1002 may be arranged for transmitting and receiving signals in a wireless medium using one or more antennas and MAC 1004 may be configured to control access to the medium. In accordance with examples, wireless communication station 1000 may be suitable for use as any one of the wireless stations illustrated in FIG. 9. In accordance with some examples, PHY 1002 may include a digital transceiver, such as the digital transceiver 100 (FIG. 1), and may be configured to transmitting and/or receiving as discussed herein.

In some examples, the wireless communication station 1000 may be configured to communicate using orthogonal-frequency division multiplexed (OFDM) communication signals over a multicarrier communication channel. In some other examples, the wireless communication station 1000 may be configured to communicate signals using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the examples is not limited in this respect.

The antennas may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) examples, the antennas may be effectively separated to take advantage of spatial diversity and the different channel characteristics that may result between each of antennas and the antennas of another communication station.

Figure 11:
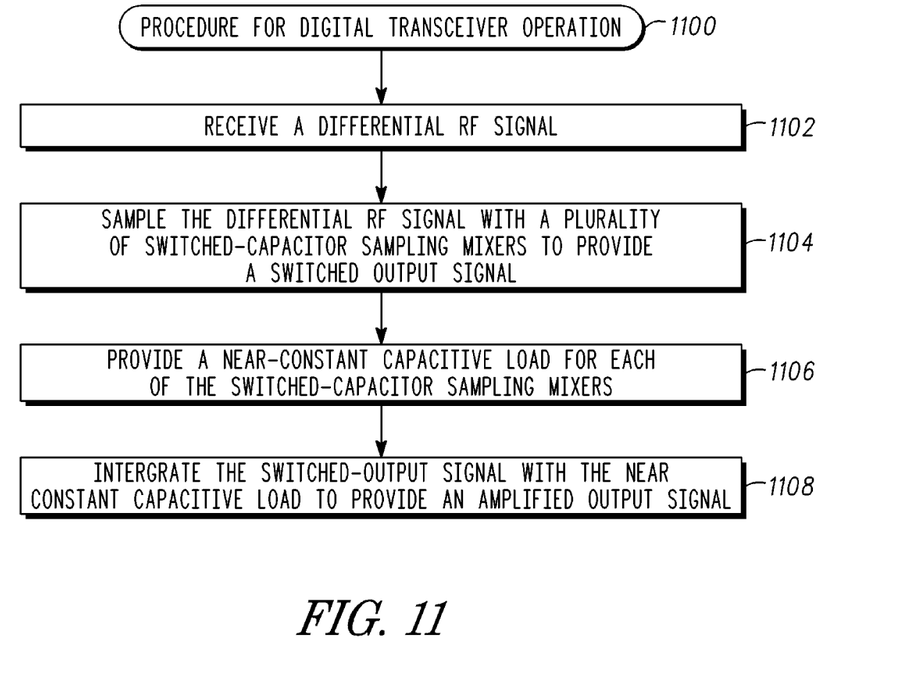
FIG. 11 illustrates a procedure for digital transceiver operation in accordance with some examples.

FIG. 11 illustrates a procedure for digital transceiver operation in accordance with some examples. Procedure 1100 may be performed by a digital transceiver, such the digital transceiver 100 (FIG. 1), although other digital transceiver configurations may be suitable for use in performing procedure 1100.

Operation 1102 comprises receiving a differential RF signal. The differential RF signal may be received at an input to a digital transceiver, such the digital transceiver 100 (FIG. 1).

Operation 1104 comprises sampling the differential RF signal with a plurality of switched-capacitor sampling mixers to provide a switched output signal 207. In some examples, coupling capacitors, such as coupling capacitors 202 (FIG. 2) may be configured to sample the differential RF signal. Switching elements, such as switching elements 204 (FIG. 2) may be configured to provide the switched output signal 207.

Operation 1106 comprises providing a near-constant capacitive load for each of the switched-capacitor sampling mixers. In some examples, the near-constant capacitive load may be provided by differential load capacitive elements 206 (FIG. 2). In some examples, the near-constant capacitive load for each switched-capacitor sampling mixer 200 may be provided by an N-stage switched-capacitor amplifier, such as N-stage switched-capacitor amplifier 500 (FIG. 5). In some examples, the near-constant capacitive load may be provided by a combination of differential load capacitive elements 206 and an N-stage switched-capacitor amplifier, such as N-stage switched-capacitor amplifier 500.

Operation 1108 comprises integrating the switched output signal 207 with the near-constant capacitive load to provide an amplified output signal. In some examples, the integrating may be performed by an N-stage switched-capacitor amplifier, such as N-stage switched-capacitor amplifier 500.

These examples may be implemented in one or a combination of hardware, firmware and software. These examples may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some examples may include one or more processors and may be configured with instructions stored on a computer-readable storage device.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate example.

What is claimed is:

1. A digital transceiver comprising:
a plurality of switched-capacitor sampling mixers, each of the switched-capacitor sampling mixers configured to sample a differential radio-frequency (RF) signal and provide a switched output signal; and
a plurality of N-stage switched-capacitor amplifiers configured as charge redistribution amplifiers where N is a non-zero positive integer equal to eight or less, each of the N-stage switched-capacitor amplifiers configured to provide a constant capacitive load for one of the switched-capacitor sampling mixers, the constant capacitive load configured to integrate the switched output signal.

2. The digital transceiver of claim 1 wherein each mixer of the plurality of switched-capacitor sampling mixers comprises:
a plurality of coupling capacitive elements to sample the differential RF signal; and
a set of switching elements responsive to a local-oscillator (LO) signal and coupled between the coupling capacitive elements and the constant capacitive load,
wherein the set of switching elements arrange the plurality of coupling capacitive elements to sample the differential RF signal and cause the constant capacitive load to integrate the switched output signal to generate a differential baseband signal.

3. The digital transceiver of claim 2 wherein each mixer of the plurality of switched-capacitor sampling mixers further includes a plurality of differential load capacitive elements to provide at least part of the constant capacitive load to integrate the switched output signal.

4. The digital transceiver of claim 2 wherein the set of switching elements arranges each coupling capacitive element to charge the constant capacitive load during a LO cycle in response to the LO signal.

5. The digital transceiver of claim 4 wherein each of the N-stage switched-capacitor amplifiers comprises a parallel combination of switched-capacitor subcell amplifiers,
wherein the switched-capacitor subcell amplifiers are configured to clock in anti-phase with each other, and
wherein a first of the switched-capacitor subcell amplifiers provides at least part of the constant capacitive load during one-half of a clock cycle and a second of the switched-capacitor subcell amplifiers provides at least part of the constant capacitive load during another half of the clock-cycle to maintain a near-constant capacitive load for the associated one of the switched-capacitor sampling mixers.

6. The digital transceiver of claim 5 wherein each of the N-stage switched-capacitor amplifiers comprise two-stage switched-capacitor amplifiers,
wherein each two-stage switched-capacitor subcell amplifier comprises a first stage and a second stage arranged in series, each stage comprising a set of switching elements and a set of capacitive elements, and
wherein the set of switching elements is responsive to the clock cycle to cause each two-stage switched-capacitor subcell amplifier to provide at least part of the constant capacitive load during half of the clock cycle.

7. The digital transceiver of claim 6 wherein, in response to the clock cycle, the set of switching elements:
arranges the capacitive elements of the first stage in parallel and the capacitive elements of the second stage in series during a first half of the clock cycle;
arranges the capacitive elements of the second stage in parallel and the capacitive elements of the first stage in series during a second half of the clock cycle;
isolates the first and second stages during the first half of the clock cycle; and
electrically couples the first and second stages to each other during the second half of the clock cycle.

8. The digital transceiver of claim 7 wherein the plurality of N-stage switched-capacitor amplifiers is configurable to operate in one of either a fixed-gain mode or a variable-gain mode,
wherein during the fixed gain mode, switching elements of each subcell switch in a fixed number of capacitive elements, and
wherein during the variable gain mode, the switching elements of each subcell switch in a different number of the capacitive elements.

9. The digital transceiver of claim 1 wherein the transceiver is a digital simplex transceiver configurable to operate in either receive mode or in transmit mode, and
wherein the switched-capacitor sampling mixers are bi-directional, each switched-capacitor sampling mixer configurable to operate in either the receive mode or the transmit mode, and,
wherein the transceiver further comprises:
a transmit-receive (TX/RX) switch provided between each switched-capacitor sampling mixer and an associated N-stage switched-capacitor amplifier; and
a current source to provide analog baseband signals to the TX/RX switches for injection of current into the switched-capacitor sampling mixers for operation in transmit mode.

10. The digital transceiver of claim 1 wherein each switched-capacitor amplifier comprises two single-ended amplifier stages configured to provide a single differential gain stage.

11. The digital transceiver of claim 1 wherein each switched-capacitor amplifier comprises a single differential switched-capacitor amplifier stage.

12. A method for digital transceiver operation comprising:
receiving a differential radio-frequency (RF) signal;
sampling the differential RF signal with a plurality of switched-capacitor sampling mixers;
providing a switched output signal with the plurality of switched-capacitor sampling mixers based on the sampling; and
providing a constant capacitive load for each of the switched-capacitor sampling mixers, the constant capacitive load provided by a plurality of N-stage switched-capacitor amplifiers where N is a non-zero positive integer equal to eight or less; and
integrating the switched output signal with the constant capacitive load.

13. The method of claim 12 further comprising:
configuring a set of switching elements in response to a local-oscillator (LO) signal to sample the differential RF signal with a plurality of coupling capacitive elements and integrate the constant capacitive load to generate a differential baseband signal.

14. The method of claim 13 wherein providing the constant capacitive load comprises providing at least part of the constant capacitive load with a plurality of differential load capacitive elements to integrate the switched output signal.

15. A switched-capacitor sampling mixer comprising:
- a pair of coupling capacitive elements to receive a differential radio-frequency (RF) signal; and
- a set of switching elements responsive to a local-oscillator (LO) signal and coupled between the coupling capacitive elements and a capacitive load, the capacitive load comprising a switched-capacitor amplifier,
- wherein the set of switching elements configure the coupling capacitive elements to sample the differential RF signal and configure the switched-capacitor amplifier to integrate a switched output signal provided by the set of switching elements to generate an output signal.

16. The switched-capacitor sampling mixer of claim 15 wherein switched-capacitor amplifier is configured as a charge redistribution amplifier, and
- wherein the switched-capacitor amplifier is configured to integrate the switched output signal to provide a constant capacitive load.

17. The switched-capacitor sampling mixer of claim 16 wherein the switched-capacitor sampling mixer is an N-stage switched-capacitor amplifier where N is a non-zero positive integer equal to eight or less and is configured to provide a conversion gain.

18. An N-stage switched-capacitor amplifier configured to operate as a charge redistribution amplifier where N is a non-zero positive integer equal to eight or less, comprising:
- a first stage and a second stage arranged in series, each stage comprising a set of switching elements and a set of capacitive elements,
- wherein the sets of switching elements are responsive to a clock cycle to cause the amplifier to provide at least part of a constant capacitive load during both halves of the clock cycle,
- wherein in response to the clock cycle, the set of switching elements:
  - arrange the capacitive elements of the first stage in parallel and arrange the capacitive elements of the second stage in series during a first half of the clock cycle; and
  - arrange the capacitive elements of the second stage in parallel and arrange the capacitive elements of the first stage in series during a second half of the clock cycle.

19. The N-stage switched-capacitor amplifier of claim 18 wherein during the first half of the clock cycle, the first and second stages are isolated from each other by one of the switching elements, and
- wherein during the second half of the clock cycle, the first and second stages are electrically coupled to each other by the one of the switching elements.

20. The N-stage switched-capacitor amplifier of claim 19, wherein the N-stage switched-capacitor amplifier operates in one of either a fixed-gain mode or a variable-gain mode.

21. The N-stage switched-capacitor amplifier of claim 20 wherein during the fixed gain mode, switching elements of each subcell switch in a fixed number of capacitive elements, and
- wherein during the variable gain mode, the switching elements of each subcell switch in a different number of the capacitive elements.

22. The N-stage switched-capacitor amplifier of claim 19 wherein the N-stage switched-capacitor amplifier comprises two single-ended amplifier stages configured to provide a differential gain stage.

23. The N-stage switched-capacitor amplifier of claim 19 wherein the N-stage switched-capacitor amplifier comprises two differential switched-capacitor amplifier stages.

* * * * *